United States Patent [19]

Nagai

[11] 4,405,875

[45] Sep. 20, 1983

[54] HERMETICALLY SEALED FLAT-TYPE PIEZO-ELECTRIC OSCILLATOR ASSEMBLY

[76] Inventor: Kiyoshi Nagai, 169-1, Nishibori, Urawa-shi, Saitama Prefecture, Japan

[21] Appl. No.: 253,043

[22] Filed: Apr. 10, 1981

[30] Foreign Application Priority Data

Jul. 24, 1980 [JP] Japan ............................... 55-101686
Aug. 26, 1980 [JP] Japan ........................... 55-120791[U]
Dec. 28, 1980 [JP] Japan ............................... 55-185654
Dec. 28, 1980 [JP] Japan ............................... 55-185655

[51] Int. Cl.³ .......................................... H01L 41/08
[52] U.S. Cl. ............................... 310/344; 174/52 FP; 310/348
[58] Field of Search ............................. 310/344, 348; 174/52 FP, 50.61; 220/82 A, 377

[56] References Cited

U.S. PATENT DOCUMENTS

| | | | |
|---|---|---|---|
| 3,190,952 | 6/1965 | Bitko | 174/52 FP |
| 3,337,678 | 8/1967 | Stelmak | 174/52 FP |
| 3,396,287 | 8/1968 | Horton | 310/344 |
| 3,509,430 | 4/1970 | Mroz | 174/52 FP X |
| 3,546,543 | 12/1970 | Messinger | 174/52 FP X |
| 3,913,195 | 10/1975 | Beaver | 310/344 X |
| 3,969,640 | 7/1976 | Staudte | 310/344 X |
| 4,191,905 | 3/1980 | Yasuda et al. | 310/344 |
| 4,303,934 | 12/1981 | Stitt | 174/52 FP X |

*Primary Examiner*—Mark O. Budd
*Attorney, Agent, or Firm*—Frishauf, Holtz, Goodman and Woodward

[57] ABSTRACT

A hermetically sealed flat-type piezo-electric oscillator assembly comprising a flat-type package and a piezo-electric oscillator encased in the package.

The flat-type package comprises metal frame, an insulating material portion united to the frame to form the package, and a plurality of lead wires passing through the insulating material portion to provide terminals inside of the package, and having opening for insertion of the piezo-electric oscillator element therein such that the piezo-electric oscillator element is mounted on the terminals of the lead wires. A lid is placed over the opening of the package so as to hermetically seal the package with the oscillator element encased therein. At least two side faces of the insulating material portion are, at least in part, positioned within the space defined by the metal frame to engage with an inwardly facing surface of the metal frame.

28 Claims, 69 Drawing Figures

FIG.1 　FIG.2-A 　FIG.2-B
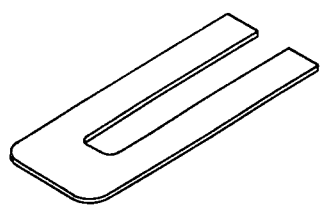
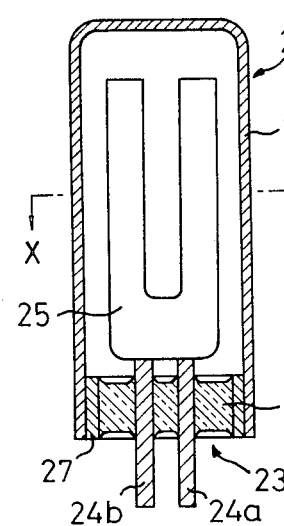
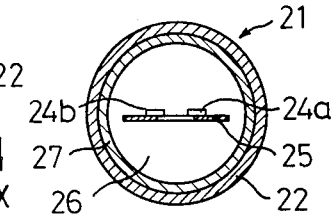
FIG.3-A
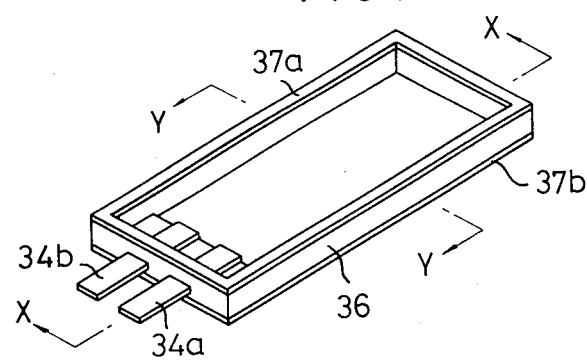
FIG.3-B 　　　　FIG.3-C
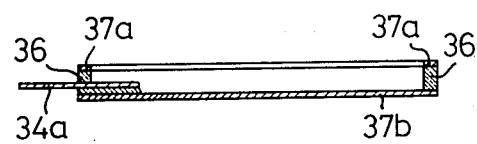
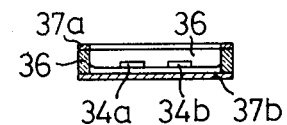

FIG.4-A
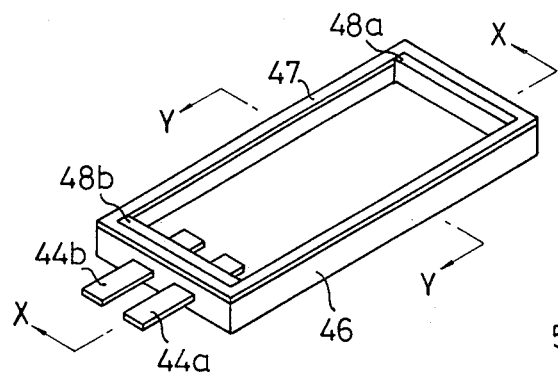
FIG.4-B
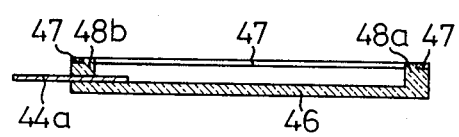
FIG.4-C
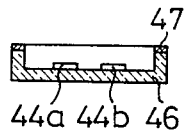
FIG.5-A
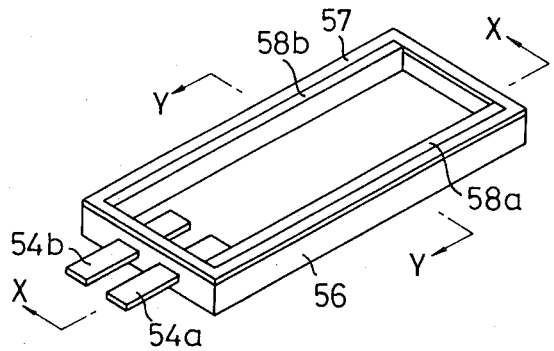
FIG.5-B
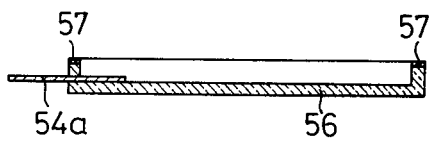
FIG.5-C
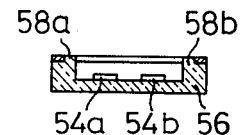

FIG.6-A
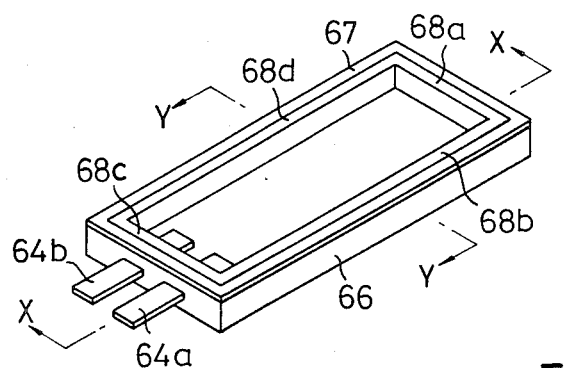
FIG.7-A
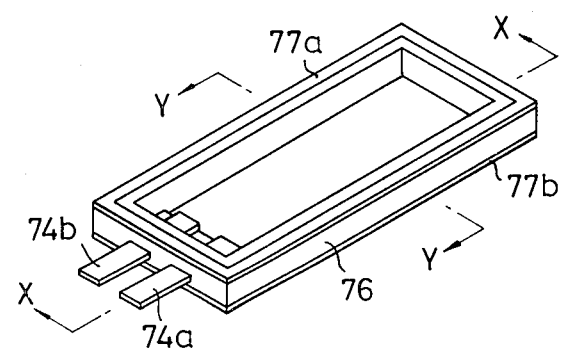
FIG.6-B
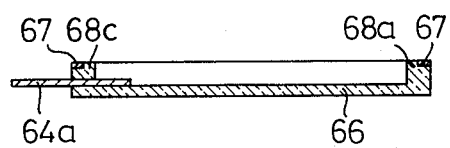
FIG.7-B
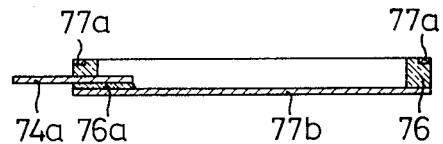
FIG.6-C
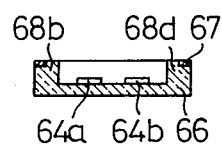
FIG.7-C
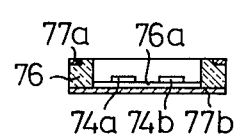

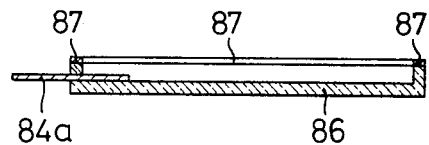
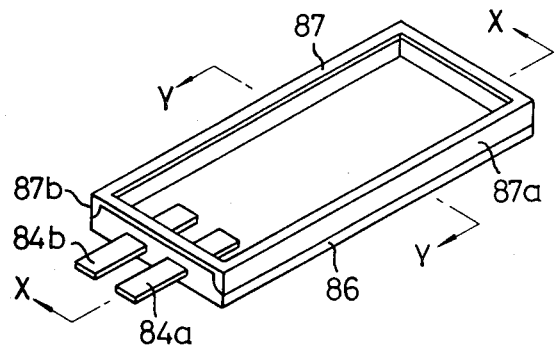
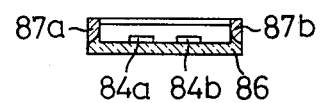
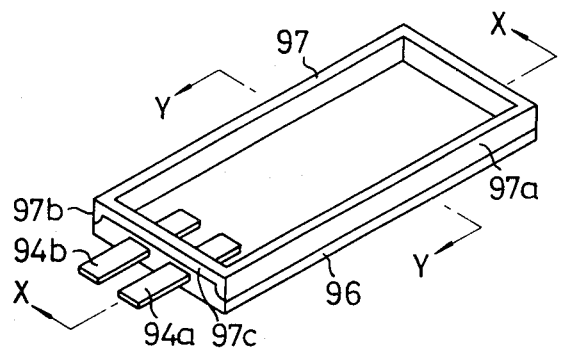
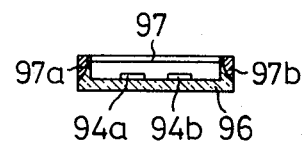
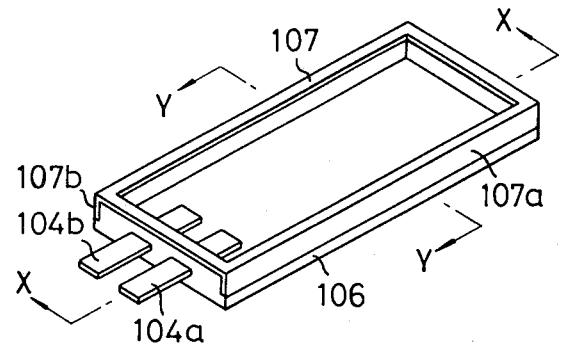

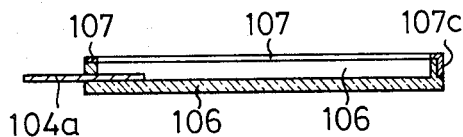
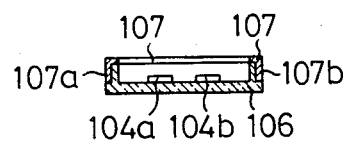
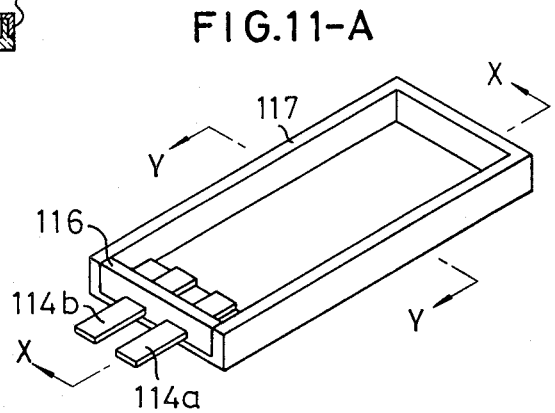
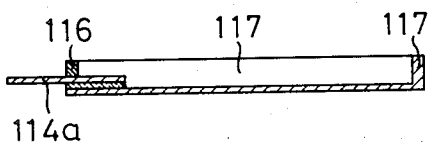
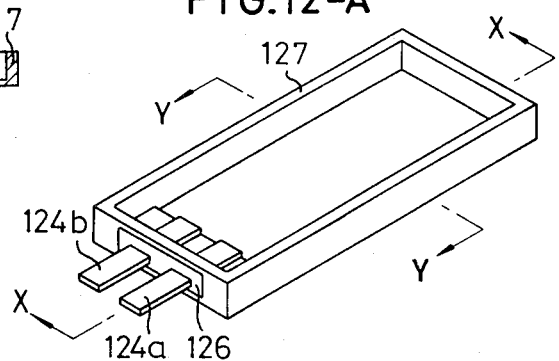
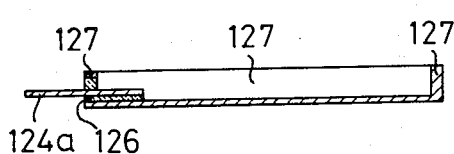
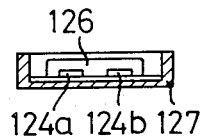
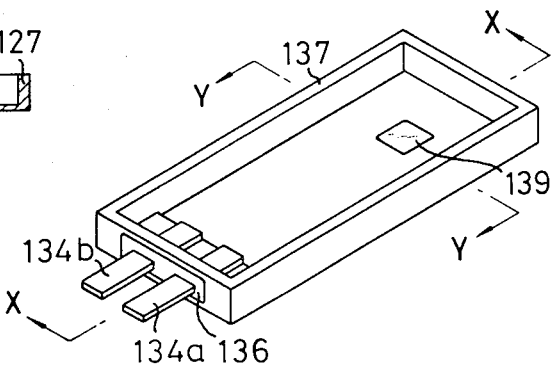

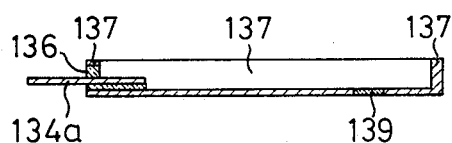
FIG.13-B
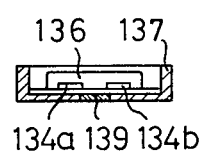
FIG.13-C
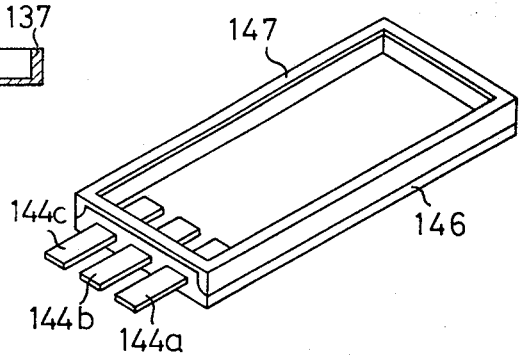
FIG.14
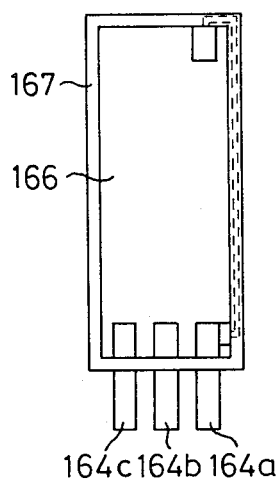
FIG.16
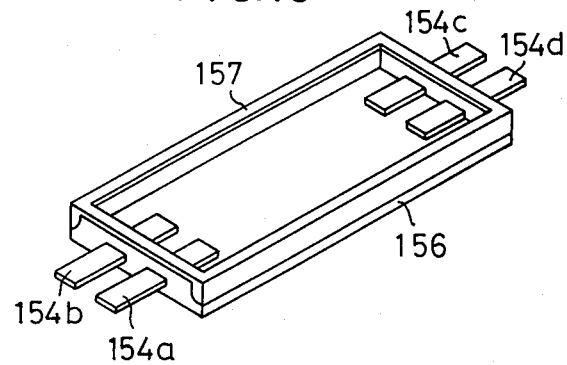
FIG.15
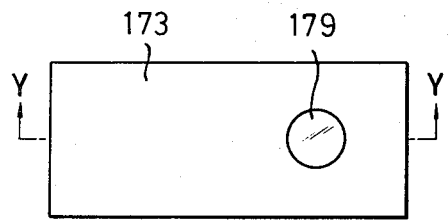
FIG.17-A
FIG.17-B FIG.18-A
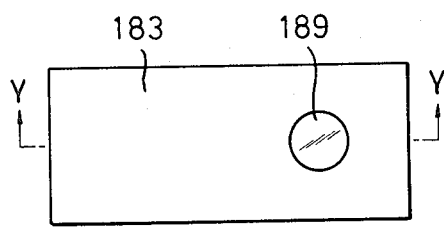
FIG.21
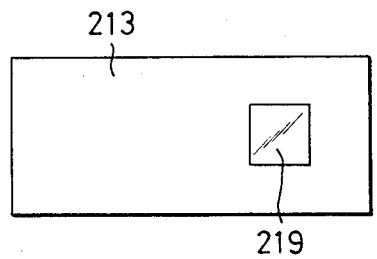
FIG.18-B
FIG.22
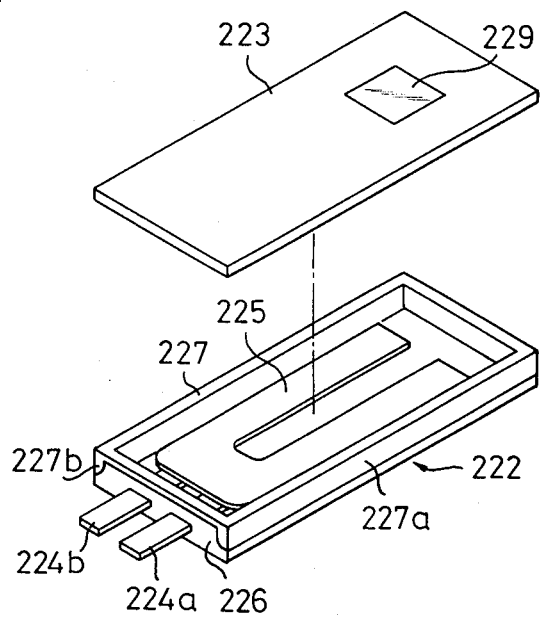
FIG.19
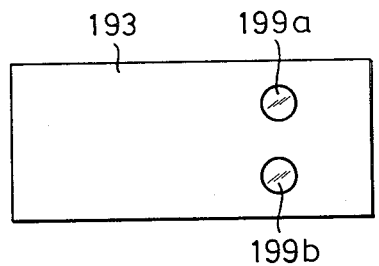
FIG.20
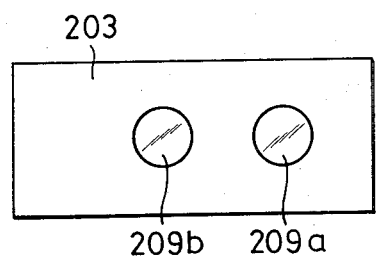

FIG.23-A
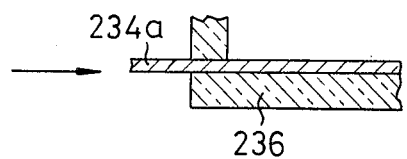
FIG.23-B
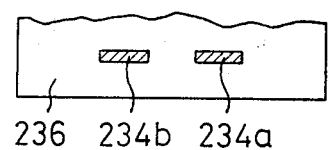
FIG.24-A
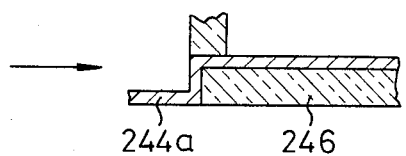
FIG.24-B
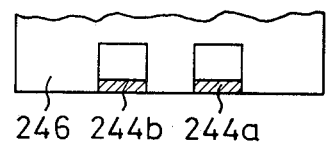
FIG.25-A
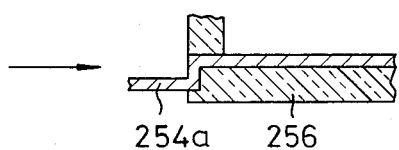
FIG.25-B
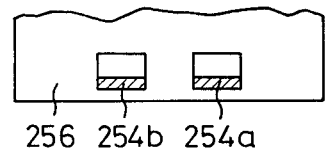
FIG.26-A
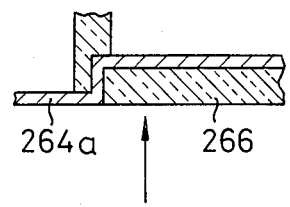
FIG.26-B
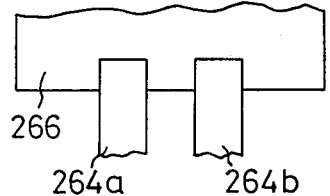
FIG.27-A
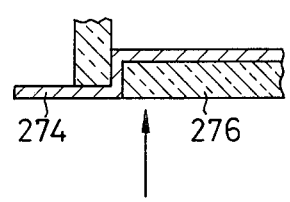
FIG.27-B
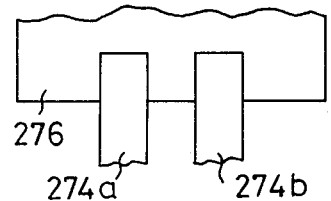

HERMETICALLY SEALED FLAT-TYPE PIEZO-ELECTRIC OSCILLATOR ASSEMBLY

BACKGROUND OF THE INVENTION

This invention relates to a hermetically sealed flat-type piezo-electric oscillator assembly, and more specifically relates to the piezo-electric oscillator assembly, a flat-type package for the assembly, a lid for sealing the package, a metal frame of the package, a set of the piezo-electric oscillator assemblies, a set of the packages, and a set of the lids.

A piezo-electric oscillator will produce an electric signal in the form of oscillation which is in direct proportion to the amount of electric, acoustical or mechanical energy applied to the oscillator. Examples of the piezo-electric oscillators include quartz crystal oscillator and ceramic resonaters.

Quartz crystal is very stable in the physical and chemical properties, and shows little oscillatory loss. Because of these advantageous characteristics, the quartz crystal is particularly considered to be suitable to give an excellent piezo-electric oscillator element. Accordingly, quartz crystal oscillator elements are practically employed in a wide variety of arts. Moreover, the quartz crystal oscillator element is recently under advantageous conditions in the practical uses, that is, large-sized quartz crystals of good quality are now prepared with no difficulty and are subjected to the practical uses in place of natural quartz crystals; and a great number of quartz crystal oscillator elements of high quality are now supplied stably and at economical prices under the influence of improvements in the process for the manufacture of oscillator elements. For these reasons, the quartz crystal oscillator element now finds a wide variety of uses, such as, oscillation source in electronic circuits of watch, telecommunication device, etc.

For the use of the quartz crystal oscillator element as the oscillation source for the electronic circuits, it is required that the temperature coefficient of the resonance frequency is at a sufficiently low level; that the secular change is substantially none; and that "Q", namely the quality factor, is at a satisfactory high level. Moreover, it is required for facilitating the handling of the oscillation source that the oscillator element be stable against mechanical vibrations given from the outside and has a simple structure.

For satisfying these requirements, the quartz crystal oscillator element is generally employed in an assembly form encasing the element; that is, the element is encased in an appropriate hermetically sealed container to keep the element from influence of undesired outer conditions such as changes of humidity and atmospheric pressure and entry of contaminants. For instance, the high-stability oscillator element having the ratio of frequency change at a level of $10^{-8}-10^{-9}$/year is encased in a hermetically sealed container in which the internal condition is kept under sufficiently high vacuum such as at a pressure of lower than $10^{-4}$ mm Hg, so as to ensure the oscillator element against variation of humidity and pressure in the outside of the container. The stabilization of frequency is furthermore ensured against change of conditions of the oscillator circuit by upgrading the Q value.

More recently, the quartz crystal oscillator assembly, namely, an encased oscillator, is employed extensively as the oscillation source for wristwatches. For this use, the oscillator assembly necessarily is prepared in a very small size, still maintaining the stability of oscillation characteristics as described above.

As described before, a large sized quartz crystal of good quality is now artificially prepared, and a thin plate having the crystal axis direction in alignment is easily obtained by slicing the large sized artificial quartz crystal. The so obtained thin plate of the quartz crystal is processed by a method conventionally employed in the art of semiconductor technology, such as the photo-etching, to give an extremely small sized tuning-fork oscillator element of the "U" shape. A tuning-fork quartz crystal oscillator element employed in an electronic wristwatch, for instance, is in a U shape of the width of approximately 0.6 mm, the length of approximately 3.5 mm, and the thickness of 0.05–0.15 mm. This extremely small sized oscillator element is, as described before, kept under vacuum in a hermetically sealed container to form an oscillator assembly so that the oscillator element can function as desired.

In a practical view, the oscillator element is generally connected to lead wire to supply the element with electric energy such as voltage to induce an oscillation, and further another lead wire is generally provided under insulation to the oscillator element to recover the oscillation signal. One lead wire can serve as either for supplying the electric energy or for recovering the oscillation signal.

Accordingly, a piezo-electric oscillator such as the quartz crystal oscillation is generally in the form of an oscillator assembly comprising a piezo-electric oscillator element, a hermetically sealable container, and a plurality of lead wires passing under insulation through the container from the outside to the inside of the container.

A representative quartz crystal oscillator assembly which is now employed as the oscillation source of an electronic wristwatch, is one whose container is in a small sized cylindrical shape. The oscillator assembly of this type comprises a hollow cylinder, whose one end is closed at the top and another end is open at the bottom; an insulating material portion provided to the open bottom of the cylinder in such a manner that the cylinder is hermetically sealed; a couple of lead wires passing through the insulating material portion from the outside to inside of the cylinder so as to provide a couple of terminals inside of the cylinder; and a quartz crystal oscillator element encased in the cylinder and mounted on the terminals by one end.

The cylindrical-shape quartz crystal oscillator assembly is employed in a great number as the oscillation source of an electronic wristwatch of a conventional type.

More recently, since a need for an electronic wristwatch of a smaller thickness than the conventional one increases, the parts and devices to be included in the wristwatch are under requirement to reduce their volumes. This requirement is naturally directed to the oscillator assembly, as well as to other parts of the wristwatch. Furthermore, a variety of electronic devices utilizing the quartz crystal oscillator assembly is likewise under requirements to reduce their volumes. Therefore, the reduction of the volume of a piezo-electric oscillator assembly such as the quartz crystal oscillator assembly is one of the principal subjects under study in the art.

The conventional cylindrical-shape piezo-electric oscillator assembly is not high in the volume efficiency, as understood from comparison between the thin-plate shaped oscillator element and the cylindrical-shape container. One of the countermeasures for avoiding the power volume efficiency is variation of the section of the cylinder from the round to an oval. However, the semi-hollow cylindrical container with the oval section is not easy in the manufacture, because the procedures involved in the manufacture of the cylindrical container with the oval section are more complicated than the procedures involved in the manufacture of the conventional cylindrical container. Moreover, the yield of acceptable final products against the total number of the final products is apt to become poor due to the complicated procedures involved. Accordingly, this modification is not considered to be practically applicable.

From another view-point, the cylindrical container has a disadvantageous feature in addition to the problem of the poor volume efficiency. At present, the electronic circuits for an electronic wristwatch is apt to be arranged in the system of extremely small sized hybrid module, for complying with the up-to-date requirements for a further smaller sized and thinner electronic wristwatch. The cylindrical-shape oscillator assembly is not advantageously applied to the hybrid module system, because the cylinder can not be suitably mounted on a base plate of the module system.

In view of these requirements, it can be thought that the container of the oscillator assembly be so changed as to have flat shape, that is, flat box-like shape.

As a flat-type container for an element conventionally employed in the electronics technology art, there can be mentioned a flat-type container for hermetically sealing a semiconductor element to give a semiconductor assembly. The flat-type container for a semiconductor element generally consists of a couple of metal frames, one serving as a lid, namely, a covering plate, and another serving as a bottom plate; and insulating material portion such as a glass material portion provided between the two plates to serve as the side wall to seal hermetically the container; and a plurality of lead wires passing through the side wall of the insulating material from the outside to the inside of the container. A container of this type is generally employed for the manufacture of a semiconductor assembly, whose dimensions are in centimeter order.

A trial for converting the above-described flat-type container employed for semiconductor to apply to the container for the small sized piezo-electric oscillator assembly fails to give satisfactory result. This is because the reduction of dimension of the container produces poor sealability due to the accompanying reduction of the sealing area.

As is known, there is a certain degree of difference of the thermal expansion coefficient between a metal and an insulating material such as glass. Even in a very matching combination of a metal and an insulating material, there inherently is a little difference of the thermal expansion coefficient between them. Accordingly, the heating process for joining the insulating material portion to the metal frames necessarily imposes a certain amount of strain on the joining face. If the joining area is sufficiently large, the joining face is able to resist against the deforming force of the strain which is likely to break down the joining face. However, if the joining area is small, the joining face is not able to resist the deforming force, so that whole or a part of the joining face is broken down to result in leakage of the container. This is the case in the application of the flat-type container for semiconductor to the flat-type container for the piezo-electric oscillator. The leakage of the container is, naturally, fatal to the oscillator assembly employed in practice. Therefore, the simple application of the flat-type container generally employed for semiconductor is not able to solve the aforementioned problems caused by the use of the conventional cylindrical container for piezo-electric oscillator.

It is, therefore, one object of this invention to provide a hermetically sealed flat-type piezo-electric oscillator assembly that is able to be constituted in an extremely small size.

It is another object of this invention to provide a hermetically sealed flat-type piezo-electric oscillator assembly showing an excellent oscillation characteristics.

It is further object of this invention to provide a hermetically sealed flat-type piezo-electric oscillator assembly that can be suitably mounted on a base plate of the module system.

It is still further object of this invention to provide a hermetically sealed flat-type piezo-electric oscillator assembly whose oscillation characteristics are easily adjustable after completion of production of the oscillator assembly.

It is still further object of this invention to provide a flat-type package for a hermetically sealed flat-type piezo-electric oscillator assembly.

It is still further object of this invention to provide a lid for hermetically sealing a flat-type package for a piezo-electric oscillator assembly.

It is still further object of this invention to provide a set of the hermetically sealed flat-type piezo-electric oscillator assemblies which is suitably handled in a mass production system.

It is still further object of this invention to provide a set of the flat-type packages and a set of the lids which are suitable to produce the hermetically sealed flat-type piezo-electric oscillator assemblies in a mass production system.

Other objects and advantages of this invention will become apparent upon reading the detailed discription given herein and with reference to the accompanying drawings.

SUMMARY OF THE INVENTION

In a principal aspect, this invention provides a hermetically sealed flat-type piezo-electric oscillator assembly comprising:

a flat-type package composed of metal frame, an insulating material portion united to the frame to form the package, and a plurality of lead wires passing through the insulating material portion to provide terminals inside of the package, and having opening for insertion of a piezo-electric oscillator element;

a piezo-electric oscillator element encased in the package in such a manner that the oscillator element is mounted on the terminals of the lead wires; and a lid placed over the opening for insertion of a piezo-electric oscillator element so as to seal hermetically the package in which the oscillator element is encased, in which at least two side faces of the insulating material portion are, at least in part, positioned within the space defined by the metal frame to engage with an inwardly facing surface of the metal frame.

DESCRIPTION OF THE DRAWINGS

FIG. 1 is a perspective view of a conventionally employed tuning-fork quartz crystal oscillator element of the "U" shape.

FIGS. 2-A and 2-B are a vertical section of a conventionally employed cylindrical-shape quartz crystal oscillator assembly and a plan section thereof taken along the line X—X, respectively.

FIG. 3-A is a perspective view of a flat-type package for a piezo-electric oscillator assembly produced under simple conversion of a flat-type package of semiconductor assembly.

FIGS. 3-B and 3-C are vertical sections of the flat-type package of FIG. 3-A taken along the lines X—X and Y—Y, respectively.

FIGS. 4-A, 4-B and 4-C are a perspective view of a flat-type package for the hermetically sealed flat-type piezo-electric oscillator assembly embodying this invention, a vertical section thereof taken along the line X—X, and a vertical section thereof taken along the line Y—Y, respectively.

FIGS. 5-A, 5-B and 5-C through FIGS. 13-A, 13-B and 13-C are perspective views of flat-type packages for the hermetically sealed flat-type piezo-electric oscillator assembly embodying this invention, vertical sections thereof taken along the line X—X, and vertical sections thereof taken along the line Y—Y, respectively.

FIGS. 14 and 15 are perspective views of flat-type packages carrying three and four lead wires, respectively, which also embody this invention.

FIG. 16 is a plan view showing another mode of the provision of the lead wires, which also embodys this invention.

FIGS. 17-A and 17-B are a plan view of a lid for hermetically sealing the flat-type package embodying this invention and a vertical section of the lid taken along the line Y—Y, respectively.

FIGS. 18-A and 18-B are a plan view of a lid for the package also embodying this invention and a vertical section of the lid taken along the line Y—Y, respectively.

FIG. 19 through FIG. 21 are plan views of lids for the package also embodying this invention, respectively.

FIG. 22 is a perspective view showing the structure of a hermetically sealed flat-type piezo-electric oscillator assembly embodying this invention in which the lid and the package encasing the oscillator element are shown in separate state.

FIGS. 23-A and 23-B are a vertical section showing a mode of fixing the lead wires to the insulating material portion of the package which embodys this invention, and a vertical view thereof viewed along the direction of arrow, respectively.

FIGS. 24-A and 24-B through FIGS. 27-A and 27-B are vertical sections showing a variety of modes of fixing the lead wires to the insulating material portion of the package which also embody this invention, and vertical views thereof viewed along the direction of arrow, respectively.

DETAILED DESCRIPTION

Figure 28:
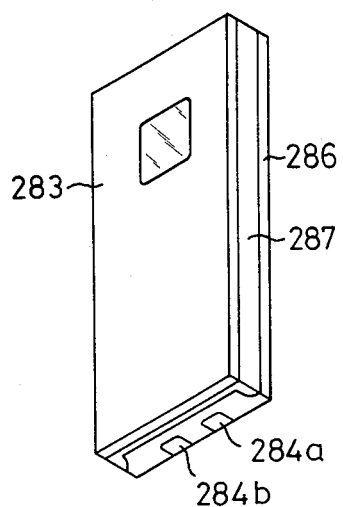
FIG. 28 is a perspective view of the oscillator assembly having the mode of fixing of the lead wires illustrated in FIGS. 24-A and 24-B, whose outwardly extending wire portions are cut off.

Referring now to the drawings, there is illustrated a conventionally employed tuning-fork quarts crystal oscillator element of the "U" shape in FIG. 1. The quartz crystal oscillator element is generally shaped in the "U" shape. However, different shapes such as a strip are also applied to the quartz crystal oscillator element, depending, for instance, upon the purpose and the mode of employment.

This invention is by no way restricted to the quartz crystal oscillator assembly, but the description of this invention will be primarily directed hereinafter to the quartz crystal oscillator assembly, for the sake of convenience. The hereinafter given description on the quartz crystal oscillator assembly are, in principle, applicable to piezo-electric oscillator assemblies of different types.

Returning to the quartz crystal oscillator element, there is generally provided a thinly plated metal layer on one or both sides of the element. The plating is done for adjusting the oscillation characteristics of the element to show the predetermined characteristics. Examples of the metals employed for the plating include gold, silver and copper, and the plating is generally carried out by the vacuum plating method.

In FIGS. 2-A and 2-B, there is provided a cylindrical-shape oscillator assembly enclosing a quartz crystal oscillator element as the oscillation source, which is generally employed at present for an electronic wristwatch.

In FIGS. 2-A and 2-B, the quartz crystal oscillator assembly 21 is composed of a hollow cylindrical metal cap 22 of the german silver (copper-nickel-zinc alloy) or the like which is open at the lower end and closed at the upper end; a stem 23 composed of an insulating material (e.g., glass) portion 26 of disk shape, a metallic stem ring 27 of iron-nickel alloy or the like, and two lead wires 24a, 24b passing perpendicularly through the insulating disk 26; and a quartz crystal oscillator element 25 of the "U" shape encased in the cap and mounted on the ends (terminals) of the lead wires 24a, 24b. The oscillator assembly 21 is under hermetical sealing and the inside thereof is maintained substantially under vacuum so that the oscillator element 25 is kept from influence of change of the external conditions. Both of the two lead wires 24a, 24b serve as means for applying electric energy to the oscillator element 25, and also serve as means for leading out the signal of oscillation produced by the oscillator element 25.

The cylindrical-type oscillator assembly 21 shown in FIGS. 2-A and 2-B is generally produced as follows.

On the terminals of the lead wires 24a, 24b to be encased in the cap is mounted the oscillator element 25 with solder or the like. On the outer surface of the stem ring 27 is plated with tin to ensure hermetical joining of the stem 23 to the cap 22. The inner surface of the cap 22 is likewise plated at the bottom with tin to ensure the joining. The so prepared stem 23 mounted with the oscillator element 25 is joined under vacuum to the so plated cap 22 under pressure and/or heating.

The so produced cylindrical-type oscillator assembly has no specific defect in the conventional uses. As described hereinbefore, however, the cylindrical shape is not suitable for reducing the volume of the assembly and for mounting on a base plate of module system.

In FIGS. 3-A, 3-B and 3-C, there is shown a flat-type package for the piezo-electric oscillator assembly which was tentatively prepared by the present inventor based on the flat-type package conventionally employed for the semiconductor assembly. In FIGS. 3-A, 3-B and 3-C, the tentatively prepared flat-type package is composed of a glass portion 36 serving as the side wall of the package and equipped with two lead wires 34a, 34b; and two plate-like metal frames 37a, 37b sandwiching the glass portion 36 therebetween. One of the metal frames placed on the upper surface, that is the metal frame 37a, is provided with an opening for introducing the oscillator element before sealing, and another metal frame 37b is a simple flat plate with no opening and serves as the bottom plate.

The production of the flat-type package shown in FIGS. 3-A, 3-B and 3-C is, per se, easily carried out by combining the conventional process for the production of the flat-type package for the semiconductor assembly with the conventional process for the production of the cylindrical-type quartz crystal oscillator assembly. However, the flat-type package for the oscillator assembly is necessarily produced in a far smaller size than that for the semiconductor assembly. This requirement results in great reduction of the joining area between the metal frame 37a, 37b and the insulating material portion 36. For this reason, the strain introduced into the joining face, namely sealing face, in the course of the joining process due to the difference of thermal expansion coefficient between the metal and the insulating material likely breaks down entirely or in part the joining face to result in leakage of the sealing, and in a certain case breaks down even the insulating material portion. The so produced leaking package is naturally not acceptable for the practical use. Thus, the yield of the production process for the package disadvantageously lowers.

Moreover, the break-down of the sealing area caused by the strain in the course of the production of the package may occur not only in the period directly after the production of the package, but also in the course of assembling the package, an oscillator element and a lid to produce the oscillator assembly, and further after completion of the assembling procedure. Accordingly, the reliability of the oscillator assembly cannot be kept at a high level.

In contrast to the above-described package, the flat-type package provided by this invention is highly resistant to the strain introduced by the difference of the thermal expansion coefficient between the metal and the insulating material.

The package of this invention comprises:

a flat-type package composed of metal frame, an insulating material portion united to the frame to form the package, and a plurality of lead wires passing through the insulating material portion to provide terminals inside of the package, and having opening for insertion of a piezo-electric oscillator element, in which at least two side faces of the insulating material portion are, at least in part, positioned within the space defined by the metal frame to engage with an inwardly facing surface of the metal frame.

The structure of the flat-type package of this invention has been invented on an assumption that the deforming force caused by the strain introduced by the difference of the thermal expansion coefficient works predominantly along the face of the sealing face, so that the strain is apt to cause the break-down of the sealing face, even at a low level of strain.

Accordingly, the characteristic feature of the package of this invention resides in the structure in which at least two side faces of the insulating material portion are, at least in part, positioned within the space defined by the metal frame to engage with an inwardly facing surface of the metal frame. This characteristic structure imparts to the flat-type package a resistance to the deforming force, which works in the direction almost perpendicular to and at least not-parallel to the sealing face between the metal frame and the insulating material portion, in addition to the resistance to the deforming force which works on the sealing face in the direction along the sealing face. Accordingly, the resistance against to break-down of the sealing face of the package is prominently enhanced.

The package provided by this invention will be further described with reference to the embodiments shown in FIGS. 4-A, 4-B and 4-C through FIGS. 13-A, 13-B and 13-C.

The flat-type package illustrated in FIGS. 4-A, 4-B and 4-C is composed of an insulating material portion 46 equipped with two lead wires 44a, 44b, and a single metal frame 47, in which vertically protruding parts 48a, 48b are provided on two side edges of the insulating material portion 46, positioned within the space defined by the metal frame 47, and engaged with the adjoining inwardly facing surface of the metal frame 47. In this package, the deforming force caused by the strain given by the difference of the thermal expansion coefficient between the metal and the insulating material works predominently on the joining face between the insulating material portion 46 and the metal frame 47 substantially in the horizontal direction to break down the joining face. The protruding parts 48a, 48b provided on the insulating material portion, however, impart a resistance against the deforming force to the package through the engagement with the vertical inner surface of the metal frame 47. Therefore, a combination of the resistance given horizontally on the joining face by the joining force and the resistance given by the mechanical engagement of the protruding parts 48a, 48b with the vertical inner surface of the metal frame 47 remarkably enhances resistance to the deforming force to effectively prevent the break-down of the sealing of the package.

The flat-type package illustrated in FIGS. 5-A, 5-B and 5-C is likewise composed of an insulating material portion 56 equipped with two lead wires 54a, 54b, and a single metal frame 57, in which the protruding parts 58a, 58b are provided on two side edges of the insulating material portion 56 in the same manner as in the package of FIGS. 4-A, 4-B and 4-C, except that the edges provided with the protruding parts are in the sides along the longitudinal direction of the package, being in contrast to the arrangement of the package of FIGS. 4-A, 4-B and 4-C. The present arrangement of the protruding parts are also effective to prevent the break-down of the sealing of the package.

The flat-type package illustrated in FIGS. 6-A, 6-B and 6-C is likewise composed of an insulating material portion 66 equipped with two lead wires 64a, 64b, and a single metal frame 67. However, the protruding parts are provided on four side edges, that is, the protruding parts 68a, 68b, 68c and 68d. The so provided four protruding parts engaged with whole inwardly facing surface of the metal frame 67 are more effective to prevent the break-down of the sealing of the package.

The flat-type package illustrated in FIGS. 7-A, 7-B and 7-C is likewise composed of an insulating material portion 76 equipped with two lead wires 74a, 74b and provided with four protruding parts 78a, 78b, 78c, 78d and metal frame. However, the metal frame of this package is composed of two units, namely, the upper face unit 77a having an opening for the introduction of an oscillator element, and the bottom face unit 77b serving as the bottom plate of the package. The effect of the four protruding parts 78a, 78b, 78c, 78d is the same as that of the four protruding parts described for the package of FIGS. 6-A, 6-B and 6-C. As for the joining between the insulating material portion 76 and the bottom face unit 77b, there may be present some weakness with respect to the resistance to the deforming face caused by the strain. However, an insulating material layer 76a provided between the lead wires 74a, 74b and the bottom face unit 77b for insulating them gives an enlarged joining area to the unit 77b. Accordingly, the joining between the insulating material portion 76 and the bottom face unit 77b is so strong as to prevent, in practice, occurrence of the break-down of sealing. The metal bottom unit gives, on the other hand, improved mechanical strength to the package.

The flat-type package illustrated in FIGS. 8-A, 8-B and 8-C is composed of an insulating material portion 86 equipped with two lead wires 84a, 84b, and a single metal frame 87, in which the metal frame 87 is provided with two flanges 87a, 87b extending downwardly from the edges of the longitudinal sides. In this package, there are not provided the vertically protruding parts as illustrated in FIGS. 4-A, 4-B and 4-C through FIGS. 7-A, 7-B and 7-C. In place of the protruding parts, the edges of the insulating material portion on the longitudinal sides are positioned within the space defined by the metal frame 87, namely, inside of the two flanges 87a, 87b and engaged with the inwardly facing surface of the flanges 87a, 87b. The provision of the flanges is more effective in the prevention of the break-down of sealing caused by the deforming force of the strain than the structure illustrated in FIGS. 4-A, 4-B and 4-C through FIGS. 7-A, 7-B and 7-C. Therefore, the yield of the production of the flat-type package of FIGS. 8-A, 8-B and 8-C is highly enhanced and the reliability of the hermetically sealed flat-type piezo-electric oscillator assembly using the so produced package is also extensively improved.

The flat-type package illustrated in FIGS. 9-A, 9-B and 9-C is likewise composed of an insulating material portion 96 equipped with two lead wires 94a, 94b, and a single metal frame 97 having flange. In this package, however, there are provided four flanges 97a, 97b, 97c, 97d, two of which 97a, 97b are positioned in the same way as in the package of FIGS. 8-A, 8-B and 8-C, and other two of which 97c, 97b are provided in such a manner as to extend downwardly from the edges of the shorter sides. The increase of the number of the flanges generally imparts to the package more enhanced resistance to the deforming force of the strain.

The flat-type package illustrated in FIGS. 10-A, 10-B and 10-C is likewise composed of an insulating material portion 106 equipped with two lead wires 104a, 104b, and a single metal frame 107 having flange. In this package, however, there are differences from the flanges of the metal frames disclosed hereinbefore, with respect to the number of the flanges and the shape of section of the flange, that is, three flanges 107a, 107b, 107c are provided, and these flanges have rectangular sections.

As seen from these embodiments of the package of this invention, there is no specific limitation on the position, number, shape and so forth of the flanges which are preferably provided to the metal frame of the package of this invention.

The flat-type package illustrated in FIGS. 11-A, 11-B and 11-C is composed of an insulating material portion 116 equipped with two lead wires 114a, 114b, and a single metal frame 117. This package is characteristic in that the three lateral side walls and the bottom portion of the package are composed of a single metal unit, namely the metal frame 117, and that the insulating material portion 116 is provided only on one lateral side through which the lead wires 114a, 114b pass. The insulating material portion 116 is therefore surrounded by the metal frame 117 at the three side faces. The flat-type package having this structure is resistant not only to the deforming force of the strain but also to mechanical impact from the outside.

The flat-type package illustrated in FIGS. 12-A, 12-B and 12-C is likewise composed of an insulating material portion 126 provided only on one lateral side and equipped with two lead wires 124a, 124b, and a single metal frame 127. In this package, however, the insulating material portion 126 is embedded within the metal frame 127, so that the break-down of the joining face between the insulating material portion 126 and the metal frame 127 hardly occurs.

The flat-type package illustrated in FIGS. 13-A, 13-B and 13-C is composed of an insulating material portion 136 provided only on one lateral side and equipped with two lead wires 134a, 134b, and a single metal frame 137 in the same way as in the package of FIGS. 12-A, 12-B and 12-C. Only one exception lies in that the metal frame 137 of this package is provided with a window 139 of transparent material on the bottom side.

The function of the transparent window 139 is as follows.

As described hereinbefore, a quartz crystal oscillator element for the use of the oscillator assembly is provided with a plated layer of gold, silver, copper or the like on the surface for the purpose of adjustment of the oscillation characteristics. The thickness, dimension, position, and so forth of the plated layer is determined in advance of the application of the plating so that the oscillator assembly can show the oscillation characteristics as predetermined. Nevertheless, there occur in the industrial process errors of the plating at some probability to produce disqualified oscillator assemblies which do not show the pre-determined oscillation characteristics.

In the production of the conventional cylindrical-shape oscillator assembly, the so produced disqualified assemblies are discarded.

The transparent window 139 functions for reviving such a disqualified assembly, that is, the oscillation characteristics of the disqualified assembly can be adjusted by removing off a part of the plated metal layer on the oscillator element by applying a high energy electron beam such as the laser beam, the electron beam, or so forth to the surface of the oscillator element through the transparent window.

As described above, the provision of the window enables converting the disqualified product to a qualified one. Accordingly, the yield of the production of the oscillator assembly can be improved.

Although in the package of FIGS. 13-A, 13-B and 13-C the transparent window for the adjustment of the oscillation characteristics is provided on the bottom side, the positon of the window is not limited to the bottom side of the package. Further, the entire face of the bottom side of the package can be formed to be transparent to facilitate the application of the high energy electron beam. Thus, the position and dimension of the window can be optionally varied, and further the shape, number and other factors of the window are also selected optionally to meet the shape, size and other features of the encased oscillator element. Some of the variations of the window will be hereinafter given in the description of a lid for the oscillator assembly.

As is apparent from the above description on the function of the window, the transparency of the window is not limited to a transparency for the visible ray. As far as the laser beam, the electron beam or other ray for removing off a part of the plated layer of the oscillator element can be passed through the window, the window is considered to be transparent. A representative of the transparent material is transparent glass.

The flat-type package illustrated in FIG. 14 is the same as that of FIGS. 8-A, 8-B and 8-C in the feature of the constitution, that is, an insulating material portion 146 equipped with a plurality of lead wires, and a single metal frame 147 are employed. However, a difference resides in the number of the lead wires, that is, the lead wires of the present package consists of three wires designated by 144a, 144b and 144c. The package of this type is appropriately employed for encasing a plurality of the oscillator elements, for instance, the so called twin quartz oscillator elements.

The flat-type package illustrated in FIG. 15 is likewise composed of an insulating material portion 156 equipped with a plurality of lead wires, and a single metal frame 157. In this package, the lead wires consists of four wires designated by 154a, 154b, 154c and 154d, in which two are on one side and other two are on the opposite side. The package of this type can be employed in the way as described for the package of FIG. 14.

The flat-type package illustrated in FIG. 16 is likewise composed of an insulating material portion 166 equipped with a plurality of lead wires, and a single metal frame 167, but the lead wires consists of three wires designated by 164a, 164b and 164c in which the lead wire 164a extends its inner end to give another terminal on the opposite side within the package.

As is understood, there is no specific limitation on the number, position, shape and other conditions of the lead wires, so far as at least two lead wires are provided in an appropriate way.

FIGS. 17-A and 17-B together show a preferred embodiment of a lid for constituting the hermetically sealed piezo-electric oscillator assembly, which is to be placed over the opening of the metal frame provided for insertion of a piezo-electric oscillator element so as to seal hermetically the package. The lid of the oscillator assembly of this invention may be in the form of a simple plate made of solid material such as metal. But, it is preferred for the lid of this invention to have a window of transparent material. The function of the window to be preferably provided to the lid is the same as that of the window provided on the bottom side of the package shown in FIGS. 13-A, 13-B and 13-C. Thus, the window may be provided to the bottom side of the package and/or the lid. However, the window is preferably provided to the lid only, from a viewpoint of mechanical strength of the oscillator assembly.

In FIGS. 17-A and 17B, a lid 173 is a simple rectangular metal plate corresponding to the figure of the package. To the lid 173 is provided a window 179 of transparent material shaped into a disk. The lateral side of the window 179 is so shaped as to give the vertical section appearing in tiers. The diameter of the window on the upper surface is larger than that on the lower surface. The lid illustrated in FIGS. 17-A and 17-B is to be placed on the package in such a manner that the lower surface is to face the oscillator element encased in the package and that the upper surface is to face the outside. The difference of the diameter of the window between the upper surface and the lower surface, that is, the arrangement of the window to decrease the diameter along the depth direction from the outer surface to the inner surface, serves for keeping the window on the lid from dropping into the inside of the assembly due to the pressure difference between the outside at an atmospheric pressure and the inside under vacuum.

In FIGS. 18-A and 18-B, there is illustrated a lid 183 likewise provided with a window 189 of the disk shape. The lateral side of the window 189 is so shaped as to give the vertical section tapering off along the depth direction from the outer surface to the inner surface. This shape also serves to keep the window on the lid from dropping into the inside of the assembly.

As easily understood from the above description, the mode of the decrease of the diameter of the window is not limited to the modes illustrated in FIGS. 17-A and 17-B and FIGS. 18-A and 18-B.

The shape, dimension, number, positon and other factors of the window are optionally determined to facilitate the application of the high energy electron beam to the encased oscillator element.

For instance, a couple of small-sized windows 199a, 199b may be provided to the lid 193 aligning in the direction perpendicular to the longitudinal axis of the lid 193, as shown in FIG. 19. Alternatively, a couple of windows 209a, 209b may be provided to the lid 203 aligning in the longitudinal direction of the lid 203, as shown in FIG. 20. The window may be shaped into square as shown in FIG. 21 in which a square window 219 is provided to the lid 213. Other shapes such as oval, triangle and rectangular may be naturally applied to the window, as desired.

FIG. 22 shows a representative structure of the hermetically sealed flat-type piezo-electric oscillator assembly of this invention in a state where the lid is separated. In FIG. 22, the flat-type package 222 is composed of an insulating material portion 226 equipped with two lead wires 224a, 224b, and a single metal frame 227 having two flanges 227a, 227b. Within the package 222, there is encased a piezo-electric oscillator element 225 in such a manner that the oscillator element 225 is mounted on the inner terminals of the lead wires 224a, 224b. A lid 223 to be placed over the upper surface of the package 222 is a flat metal plate provided with a window 229 made of transparent material such as glass.

There are no specific limitations on the materials of the metal frame, the insulating material portion, the lead wires and the lid, so far as the materials have characteristics required for sealing hermetically the oscillator element in the form of assembly. For general purposes, materials employed for the conventional quartz crystal oscillator assembly of the cylindrical shape or the conventional flat-type package for semiconductor are employed.

Examples of the material to form the metal frame include iron-nickel alloy, the iron-nickel-cobalt alloy called Kovar, and copper. A representative example of the material to form the insulating material portion is glass such as hard glass or soft glass. However, other insulating materials such as ceramic and synthtic resin can be employed. The difference of the thermal expansion coefficient between the metal and the insulating material which produces the strain on the joining area is preferably minimized as far as possible. Accordingly, the metal and the insulating material are generally selected to give a combination showing little difference of the thermal expansion coefficient therebetween. One of the preferred combination consists of the Kovar alloy and borosilicate glass. The insulating material portion is shaped into a desired figure by a variety of methods, such as application of the photoetching process used in the art, a moulding process, and other known methods. The lid is preferably made of the same metal as employed for the metal frame of the package.

The sealing between the package and the lid is done by joining hermetically the surface of the lid to the upper surface of the metal frame of the package in the conventional manner for assembling a cap and a stem of the cylindrical-shape quartz crystal oscillator assembly. For instance, one or both of surfaces to form the joining face are coated with tin plating in advance of the joining, and then the joining procedure is carried out under vacuum by placing the lid on the package under pressure and/or heating. Otherwise, the sealing can be carried out by applying soft solder onto the tin-plated faces and combining these surfaces under vacuum.

As described hereinabove, the flat-type package for the oscillator assembly of this invention shows an enhanced resistance to deforming force of strain caused in the course of the heating process due to the difference of thermal expansion coefficient between the metal frame and the insulating material portion, so that the sealing face formed between the metal frame and the insulating material portion is hardly broken down. Accordingly, the yield of the package in the production is kept at a high level.

Moreover, the hermetically sealed flat-type piezo-electric oscillator assembly employing the flat-type package of this invention, accordingly, is highly resistant to the deforming force of the strain. For this reason, the yield and the reliability of the oscillator assembly of this invention are also kept at high levels. The provision of the window of transparent material to the lid and/or the package can further improve the yield of the oscillator assembly.

FIGS. 23-A and 23-B through FIGS. 27-A and 27-B show different modes of fixing of the lead wires to the insulating material portion of the package.

FIGS. 23-A and 23-B show the simplest mode of the fixing in which straight lead wires 234a, 234b are fixed to the insulating material portion 236.

FIGS. 24-A and 24-B show a mode of the fixing in which parts of the lateral surfaces of the lead wires 244a, 244b are exposed to the outside of the package in such a manner that the exposed lateral surfaces of the lead wires 244a, 244b are positioned at substantially same level as the outer surface of the insulating material portion 246 on the lateral side of the package. The fixing of this mode is stronger than that of FIGS. 23-A and 23-B.

The lead wires provided in the mode of FIGS. 24-A and 24-B can be cut at the base to remove the outwardly extending portions so that the lateral surfaces of the lead wires exposed on the outer surface of the package can be utilized as the outernal terminals. The role of the so prepared outernal terminal will be described hereinafter.

FIGS. 25-A and 25-B show a mode of the fixing similar to that of FIGS. 24-A and 24-B in which parts of the lateral surfaces of the lead wires 254a, 254b are exposed to the outside of the package in such a manner that the exposed lateral surfaces of the lead wires 254a, 254b are positioned at substantially same level as the outer surface of the insulating material portion 256 on the lateral side of the package. In this mode, however, the outwardly extending lead wires 254a, 254b are positioned on a level higher than the outer surface of the bottom of the package.

FIGS. 26-A and 26-B show a mode of the fixing in which parts of the lateral surfaces of the lead wires 264a, 264b are exposed to the outside of the package in such a manner that the exposed lateral surfaces of the lead wires 264a, 264b are positioned at substantially same level as the outer surface of the insulating material portion 266 on the bottom side of the package.

In FIGS. 27-A and 27-B, the mode of fixing of the lead wires 274a, 274b to the insulating material portion 276 is similar to that of FIGS. 26-A and 26-B, with an exception that the vertically extending portions of the lead wires 274a, 274b are embedded in a forwardly advanced position so that the outwardly exposed lateral surfaces of the lead wires 274a, 274b can be enlarged.

FIG. 28 illustrates the oscillator assembly employing the mode of fixing of the lead wires to the package of FIGS. 24-A and 24-B in which the outwardly extending lead wires are cut off at the base. In FIG. 28, there is seen the oscillator assembly comprising a lid 283 and a package comprising an insulating material portion 286, a metal frame 286 having flange, and lead wires 284a, 284b exposed on the lateral side of the package.

Figure 29:
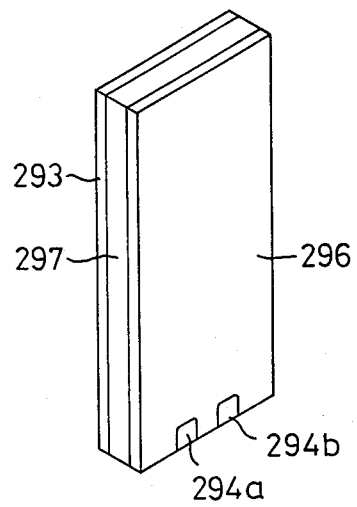
FIG. 29 is a perspective view of the oscillator assembly having the mode of fixing of the lead wires illustrated in FIGS. 27-A and 27-B, whose outwardly extending wire portions are cut off.

FIG. 29 illustrates the oscillator assembly employing the mode of fixing of the lead wires to the package of FIGS. 26-A and 26-B or FIGS. 27-A and 27-B in which the outwardly extending lead wires are cut off at the base. In FIG. 29, the oscillator assembly comprises a lid 293 and a package comprising an insulating material portion 296, a metal frame 297 having flange, and lead wires 294a, 294b exposed on the bottom side of the package.

The oscillator assemblies illustrated in FIGS. 28 and 29 which have no outwardly protruding portions are suitably mounted on a base plate of the module system.

FIG. 30 through FIG. 34 show different shapes of parts of the lead wires which are to be embedded in the insulating material portion. There is no limitation on the shape of the lead wires, and any lead wire employed for general purposes can be used for this invention. However, the lead wires processed, in advance of fixing to the insulating material portion, to have the shapes shown in FIG. 30 through FIG. 34 are preferably employed for this invention, because the processing of lead wires to enlarge the surface area or to have perforation is effective for increasing the strength of the fixing of the lead wires to the insulating material portion, and accordingly the airtightness of the sealing is more improved.

Figure 30:
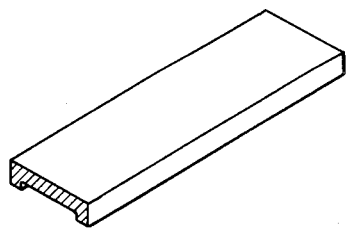
FIGS. 30 and 31 are views showing sections of the lead wire preferably adoptable in this invention.
Figure 31:
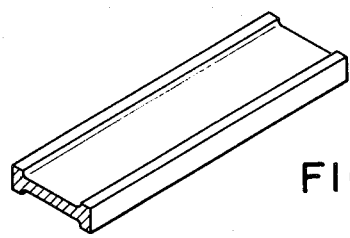

In FIGS. 30 and 31, one and both of the surfaces of lead wires having the rectangular section are processed to have concave, respectively. The processing of the lead wire in these ways is employable to enlarge the surface area.

Figure 32:
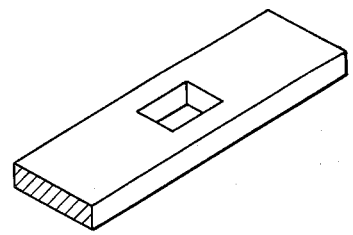
FIG. 32 through FIG. 34 are views showing perforations which are preferably provided to the portion of the lead wire which is to be embedded in the insulating material portion of the package of this invention.
Figure 33:
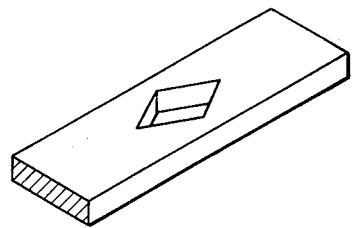
Figure 34:
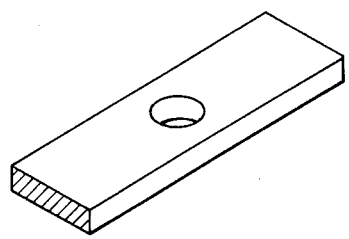

In FIGS. 32, 33 and 34, the lead wires are provided with perforations in the rectangular, lozenge and round patterns to ensure the fixing of the lead wire to the insulating material portion of the package.

Figure 35:
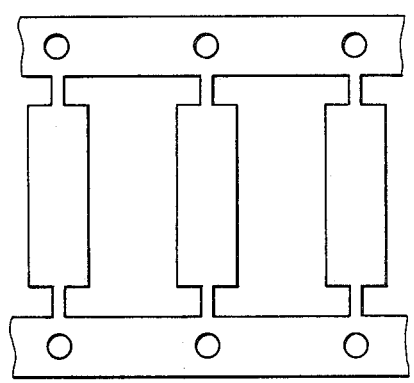
FIG. 35 is a plan view showing a metal strip partly processed by the photoetching method to give a set of a plurality of metal frames for the package or a set of a plurality of lids.

The metal frame, lid and lead wires constituting the oscillator assembly of this invention can be prepared from a metal plate, a metal strip and so forth by conventional mechanical means. However, since these parts are required to be shaped in extremely small size, the arts appropriate for preparing and processing small sized parts such as the photoetching method, the laser beam processing and the electron beam processing can be preferably adopted for the preparation of the metal frame, lid and lead wires of this invention. The part of the assembly such as the metal frame can be prepared individually, but the part is preferably prepared in the form of a set comprising a plurality of the parts as illustrated in FIG. 35.

Figure 36:
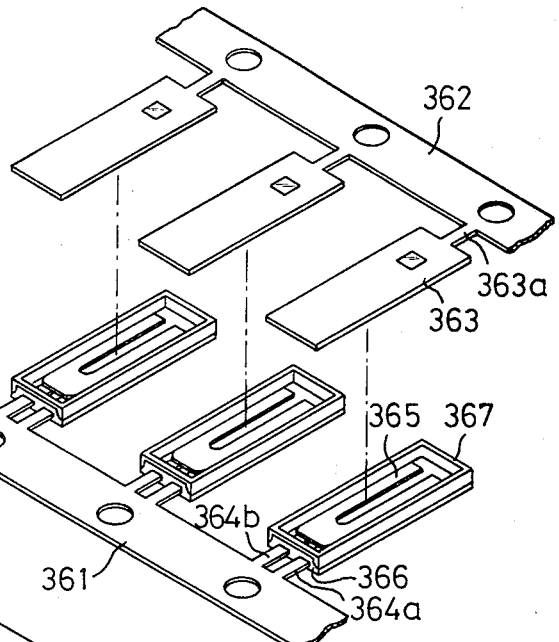
FIG. 36 is a perspective view showing a set of a plurality of a hermetically sealed flat-type piezo-electric oscillator assembly embodying this invention in which the lids and the packages encasing the oscillator element are shown in separate state.

FIG. 36 shows a plurality of the packages composed of an insulating material portion 366 carrying two lead wires 364a, 364b, and a metal frame 367 in the form of a set in which the packages are attached to a lateral side of a metal strip 361 through the outwardly extending lead wires in a row and in parallel to each other so as to form a belt-shaped set. In FIG. 36, there is further illustrated a set of the lids in which a plurality of the lids 363 are attached to a lateral side of a metal strip 362 through supporting portions 363a extended from the lids 363, in a row and in parallel to each other so as to form a belt-shaped set. A set of the parts in which a plurality of the parts shaped in the completely same figure are combined by means of a metal strip can be easily and accurately handled on an automatic machine to facilitate the production of the parts and further to facilitate the final assembling process for the production of the oscillator assembly.

Into each of the packages illustrated in the form of a set in FIG. 36, a single oscillator element 365 is introduced.

Figure 37:
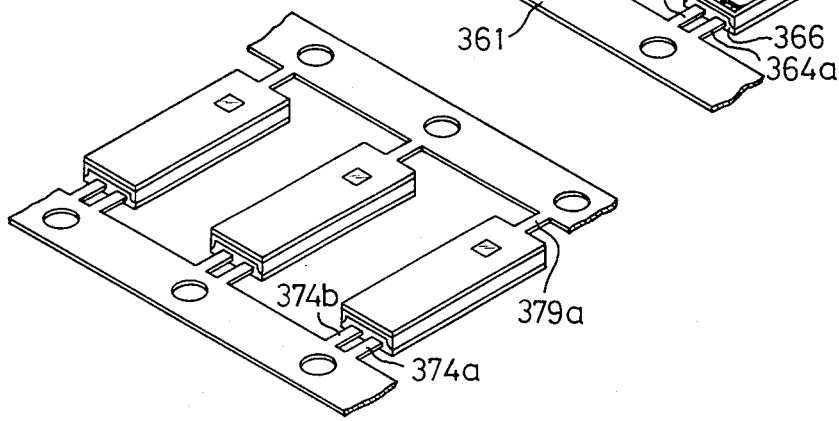
FIG. 37 is a perspective view showing the set of a plurality of the oscillator assembly of FIG. 36 in which the lids and the packages are hermetically sealed therebetween.

FIG. 37 shows a set of the hermetically sealed flat-type piezo-electric oscillator assemblies in which a plurality of the oscillator assemblies are attached to a lateral side of a metal strip through the outwardly extening lead wires 374a, 374b in a row and in parallel to each other so as to for a belt-shaped set. In FIG. 37, the set of the oscillator assemblies is also attached to a lateral side of a metal strip through supporting portions 373a extended from the lids.

The set of the oscillator assemblies shown in FIG. 37 is then handled to cut the supporting portions 373a and the outwardly extending lead wires 374a, 374b in appropriate sites to give a separated hermetically sealed flat-type piezo-electric oscillator assembly of this invention.

Figure 38:
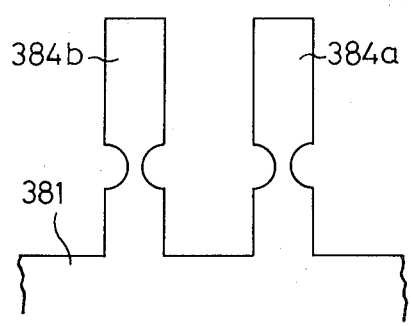
FIGS. 38 and 39 are parts of plan views of metal springs carrying a plurality of protruding portions of different types which are to serve as the lead wires.
Figure 39:
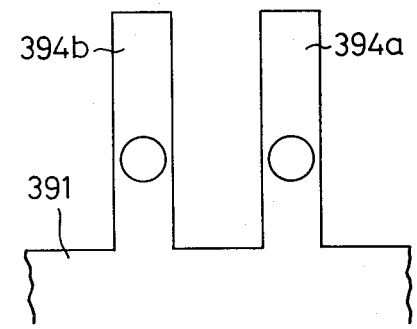

The lead wires can be processed in advance to have concaved portions or perforation such as shown in FIG. 38 or FIG. 39, in which the concaved portions or the perforation are provided on the lead wires 384a, 384b or 394a, 394b in the vicinity of the portions connected to the metal strips 381 and 391, respectively, to facilitate the separation of the oscillator assembly from the metal strip.

I claim:

1. A hermetically sealed piezo-electric oscillator assembly comprising:
   a flat-type package comprising a metal frame and an insulating material portion connected to said metal frame,
   said metal frame having an upper surface and an inwardly facing surface portion which faces inwardly of said package;
   at least a part of said insulating material portion forming a side wall of said package;
   said insulating material side wall having an upper, outwardly facing surface portion which is held in contact with said inwardly facing surface portion of said metal frame;
   said inwardly facing surface portion of said metal frame having an area larger than the area defined by the corresponding upper surface of said metal frame; and
   said package including lead wires passing through said insulating material portion to provide terminals inside said package;
   a piezo-electric oscillator element mounted inside said package on said terminals; and
   a lid closing the package to encase and hermetically seal said piezo-electric oscillator element inside said package.

2. The assembly of claim 1, wherein said metal frame is formed as one piece.

3. The assembly of claim 1, wherein said metal frame comprises one part forming an opening for insertion of said piezo-electric oscillator element and another part forming a bottom wall of said package; said lid closing said opening.

4. The assembly of claim 1, wherein said metal frame has a flange having an inwardly facing surface in contact with said upper portion of said insulating material wall.

5. The assembly of any one of claims 1, 2, 3 or 4, wherein said package has a bottom wall; and wherein at least one window of transparent material is provided in said bottom wall of said package.

6. The assembly of claim 2, wherein said package has a transparent bottom wall.

7. The assembly of claim 1, wherein each lead wire has a laterally extending surface of which a part is exposed outside the package such that the exposed surface of the lead wire is positioned at substantially the same level as an outer surface of said package.

8. The assembly of claim 7, wherein said laterally extending surface of each lead wire emerges on one of a side and end face of said package.

9. The assembly of claim 7, wherein said package has a bottom surface; and wherein said laterally extending surface of the lead wire emerges on said bottom surface of said package.

10. The assembly of claim 1 or 2, wherein at least one window of transparent material is provided in said lid.

11. The assembly of claim 10, wherein said at least one window has a diameter which decreases continuously or intermittently from the outer surface to the inner surface of said lid.

12. The assembly of claim 11, wherein the diameter of said window tapers off in the direction of its depth from its outer surface to its inner surface.

13. The assembly of claim 11, wherein the diameter of said window decreases stepwise.

14. The assembly of claim 1, wherein a part of the lateral side of each lead wire which passes through said insulating material portion is processed to enlarge its surface area.

15. The assembly of claim 1, wherein each lead wire is perforated in the part thereof that passes through said insulating material portion.

16. The assembly of claim 1, wherein said oscillator element is a quartz crystal element.

17. The assembly of claim 1, wherein said insulating material portion is made of glass material.

18. The assembly of claim 1, wherein said metal frame is manufactured from a single metal plate by application of a photo-etching process.

19. The assembly of claim 1, wherein said metal frame is manufactured from a single metal plate by application of a laser beam processing.

20. The assembly of claim 1, wherein said metal frame is manufactured from a single metal plate by application of a electron beam processing.

21. A flat-type package for a hermetically sealed piezo-electric oscillator assembly, the package comprising:
a metal frame and an insulating material portion connected to said metal frame, and forming a structure having an opening for insertion of a piezo-electric oscillator element;
said metal frame having an upper surface and an inwardly facing surface portion which faces inwardly of said package;
at least a part of said insulating material portion forming a side wall of said package;
said insulating material side wall having an upper, outwardly facing surface portion which is held in contact with said inwardly facing surface portion of said metal frame;
said inwardly facing surface portion of said metal frame having an area larger than the area defined by the corresponding upper surface of said metal frame; and
said package including lead wires passing through said side wall part of said insulating material portion to provide terminals inside said package.

22. The package of claim 21, wherein said metal frame is formed in one piece.

23. The package of claim 21, wherein said metal frame has a flange having an inwardly facing surface; and wherein at least a portion of at least one side face of said insulating material portion engages said inwardly facing surface of said flange.

24. The package of any one of claims 21, 22 or 23, wherein said insulating material portion is made of glass material.

25. The package of claim 21, further comprising a lid closing and hermetically sealing said opening of said package.

26. The package of claim 25, wherein said opening is formed in said metal frame.

27. A set of assemblies as claimed in claim 1, wherein a plurality of said assemblies are attached in a row and in parallel with each other to a lateral side of a metal strip through their respective lead wires so as to form a set in the form of a belt.

28. A set of packages as claimed in claim 21, wherein a plurality of said packages are attached in a row and in parallel with each other to a lateral side of a metal strip through their respective lead wires so as to form a set in the form of a belt.

* * * * *